(12) United States Patent
Wu

(10) Patent No.: US 7,518,306 B2
(45) Date of Patent: Apr. 14, 2009

(54) LIGHT UNIT WITH STAGGERED ELECTRODES

(76) Inventor: Jiahn-Chang Wu, No. 15, Lane 13, Alley 439, Her-Chiang Street, Chutung, Hsin-Chu (TW) 310

( * ) Notice: Subject to any disclaimer, the term of this patent is extended or adjusted under 35 U.S.C. 154(b) by 262 days.

(21) Appl. No.: 11/459,377

(22) Filed: Jul. 24, 2006

(65) Prior Publication Data
US 2007/0267964 A1   Nov. 22, 2007

(30) Foreign Application Priority Data
May 18, 2006   (TW) .............................. 95117588 A

(51) Int. Cl.
*H01J 1/62* (2006.01)
*H01J 63/04* (2006.01)
(52) U.S. Cl. ..................... 313/498; 313/512; 257/100

(58) Field of Classification Search ......... 313/498–512; 257/40, 98–100
See application file for complete search history.

(56) References Cited

U.S. PATENT DOCUMENTS

| 6,998,650 | B1* | 2/2006 | Wu ........................... 257/100 |
| 2001/0022367 | A1* | 9/2001 | Nakamura et al. ............ 257/99 |
| 2002/0063301 | A1* | 5/2002 | Hanamoto et al. ........... 257/432 |
| 2004/0004435 | A1* | 1/2004 | Hsu ........................... 313/512 |
| 2004/0239243 | A1* | 12/2004 | Roberts et al. .............. 313/512 |
| 2007/0091620 | A1 | 4/2007 | Matheson |

* cited by examiner

*Primary Examiner*—Joseph L Williams
*Assistant Examiner*—Kevin Quarterman
(74) *Attorney, Agent, or Firm*—Lowe, Hauptman, Ham & Berner, LLP

(57) ABSTRACT

A staggered light unit has a top-bottom electrode lead. The light unit is insertable into a substrate having a metal/insulation/metal sandwich structure.

8 Claims, 8 Drawing Sheets

LIGHT UNIT WITH STAGGERED ELECTRODES

RELATED APPLICATIONS

The present application is based on, and claims priority from, Taiwan Application Number 095117588, filed May 18, 2006, the disclosure of which is hereby incorporated by reference herein in its entirety.

TECHNICAL FIELD

The present invention is related to a light board, especially a light board with insertion-type light units.

RELATED ART

FIG. 1. is a traditional light unit. The conventional light unit is made up with a light-emitting diode (LED) chip 10 in a cup 13 of a metal lead 11 with a bottom electrode of the chip electrically coupling to the metal lead 11, with a top electrode of the chip coupling via wire bonding 14 to another metal lead 12. Transparent glue or encapsulant 15 covers the chip 10, wire 14, cup 13 and top portions of the two leads 11 and 12. The traditional light unit has parallel leads 11 and 12, and the two leads are equal in length. In a traditional light board or display, such traditional light units are mounted on a printed circuit board with the two leads inserted into corresponding two plated through holes in the printed circuit board.

SUMMARY

A first object of the present invention is to provide a light board which a light unit can be easily mounted on and easily dismounted from. A second object of the present invention is to provide a light unit that is easy to mount with insertion motion only and without using any soldering or gluing process. A third object of the present invention is to provide a light unit that can be mounted on a board by insertion without using any heating process. A fourth object of the present invention is to provide a MIM (metal/insulation/metal) sandwiched substrate for receiving and supporting insertion-type light units. A fifth object of the present invention is to provide a light board that allows easy replacement of light units either for repair, maintenance, color change, or for pattern change with simple actions such as pulling and insertion.

A light unit with staggered electrodes, comprising a light unit, having a first electrode and a second electrode; a first metal lead, coupled to said first electrode, and having a first exposed conductive portion; and a second metal lead, coupled to said second electrode, and having a second exposed conductive portion staggered with said first exposed conductive portion to form a top-bottom electrode structure.

DETAILED DESCRIPTION OF EMBODIMENTS

Figure 1:
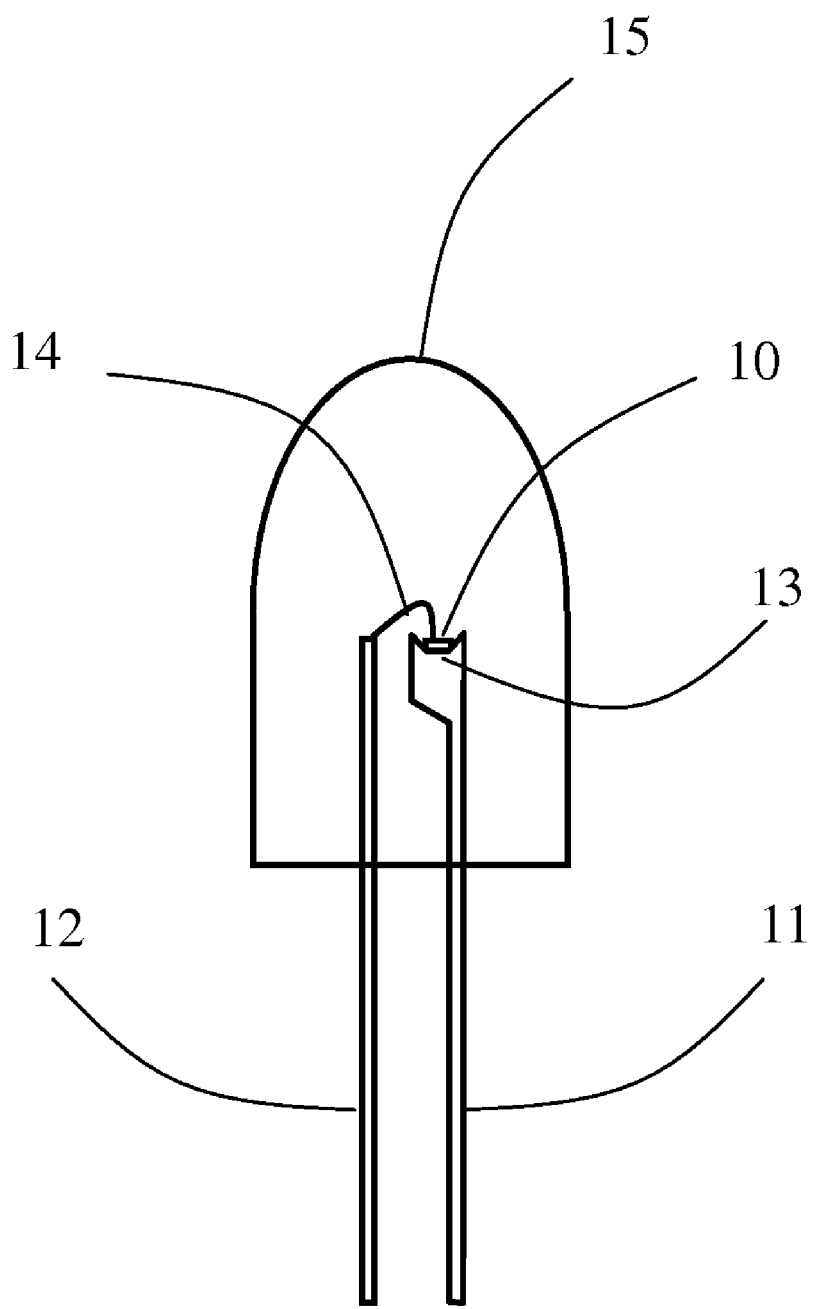
FIG. 1. shows a traditional light unit.
Figure 2:
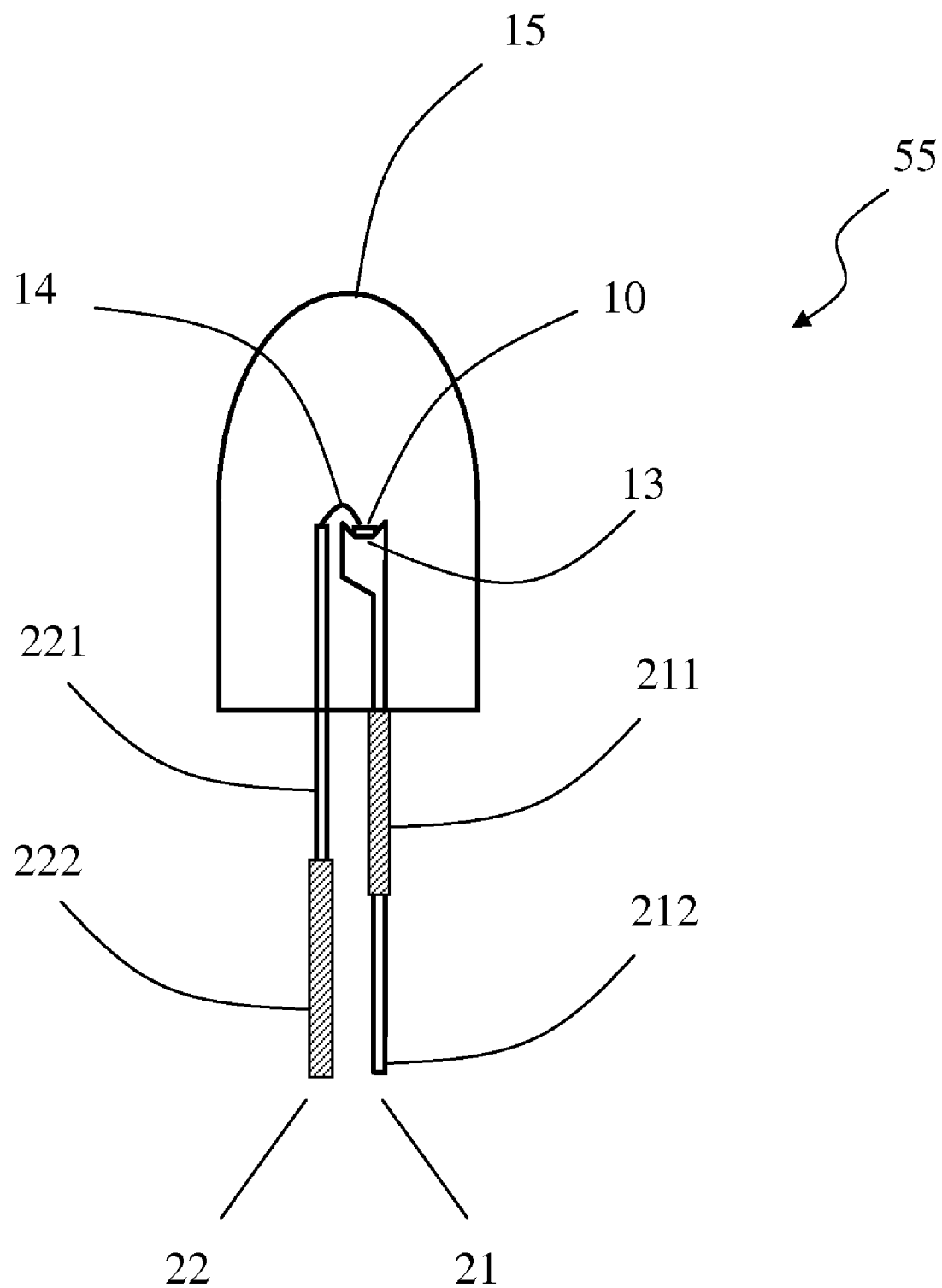
FIG. 2. shows a first embodiment of a staggered light unit according to the present invention.

FIG. 2. is a first embodiment according to the present invention. A staggered light unit with staggered electrodes 21 and 22, comprises: an LED chip 10 that sits in a cup 13 on the top of a first metal lead 21. The LED 10 has a first electrode-bottom electrode and a second electrode-top electrode. The first metal lead 21 couples to the first electrode-bottom electrode through direct contact with, e.g., conductive glue or solder. The first metal 21 has a first conductive portion 212 and an insulated portion 211. The second metal lead 22 couples to the second electrode-top electrode through wire bonding 14. The second metal lead 22 has a second conductive portion 221 staggered with the first conductive portion 212 to form a top-bottom electrode structure of the light unit. The second metal lead 22 has an insulated portion 222. Protection glue or encapsulant 15 seals the chip 10, wire 14, cup 13, and top portions of the two leads. The lower metal portion 212 of the metal lead 21 functions as a bottom electrode of the light unit 55 and the top metal portion 221 of the metal lead 22 functions as a top electrode of the light unit 55.

The wire bonding between the LED's top electrode and the extension metal 22 and the metal direct contact between the LED's bottom electrode and the extension metal 21 are for example only, a person skilled in the art can switch the bonding/contact or use the same bonding or contact for both metals 21, 22. The top electrode and the bottom electrode for the chip 10 are also for example only. A person skilled in the art may use a chip having both electrodes either on bottom or on top or a side surface, and arrange coupling of the chip's electrodes to the metal extensions using well-known conventional methods.

Figure 3:
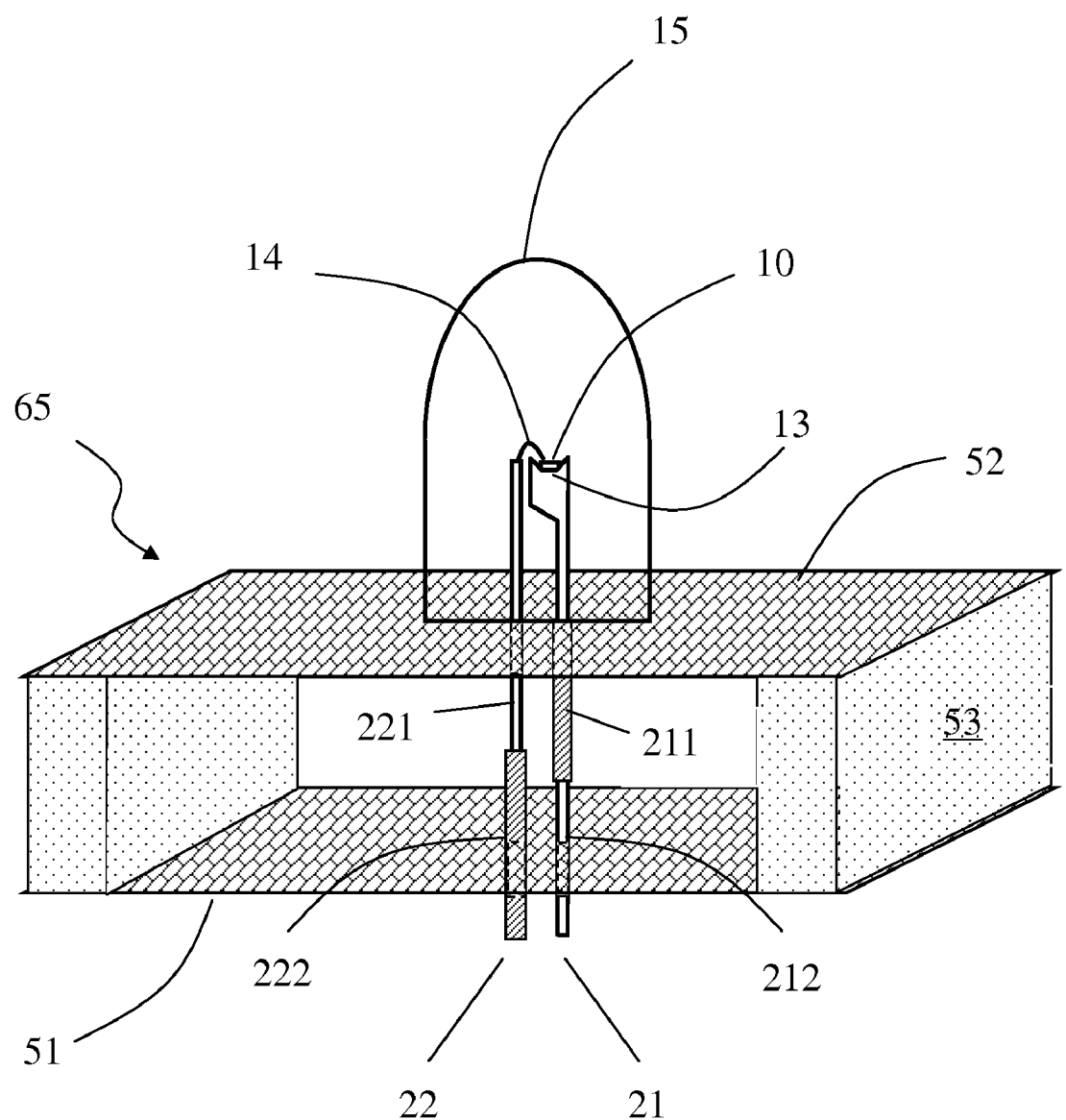
FIG. 3. shows a sandwiched substrate with an inserted staggered light unit according to the present invention.

FIG. 3. shows a MIM sandwiched structure 65 with an inserted staggered light unit as shown in FIG. 2. A first metal layer 51 and a second metal layer 52 are electrically insulated by spacers 53. The first metal layer 51, insulation material 53, and the second metal layer 52 form a sandwich structure. When a staggered light unit 55 of FIG. 2 is inserted into the MIM sandwich structure 65, the staggered electrodes 21, and 22 of the light unit 55 are electrically coupling to the first metal layer 51 and the second metal layer 52, respectively. The staggered light unit 55 emits light when power is provided to the first metal layer 51 and the second metal layer 52. The insulated portion 211 of the bottom electrode of the first metal lead 21 prevents the first metal lead 21 from contacting the second metal layer or top metal layer 52. The insulated portion 222 of the top electrode of the second metal lead 22 prevents the second metal lead 22 from contacting the first metal layer or bottom layer 51.

Figure 4:
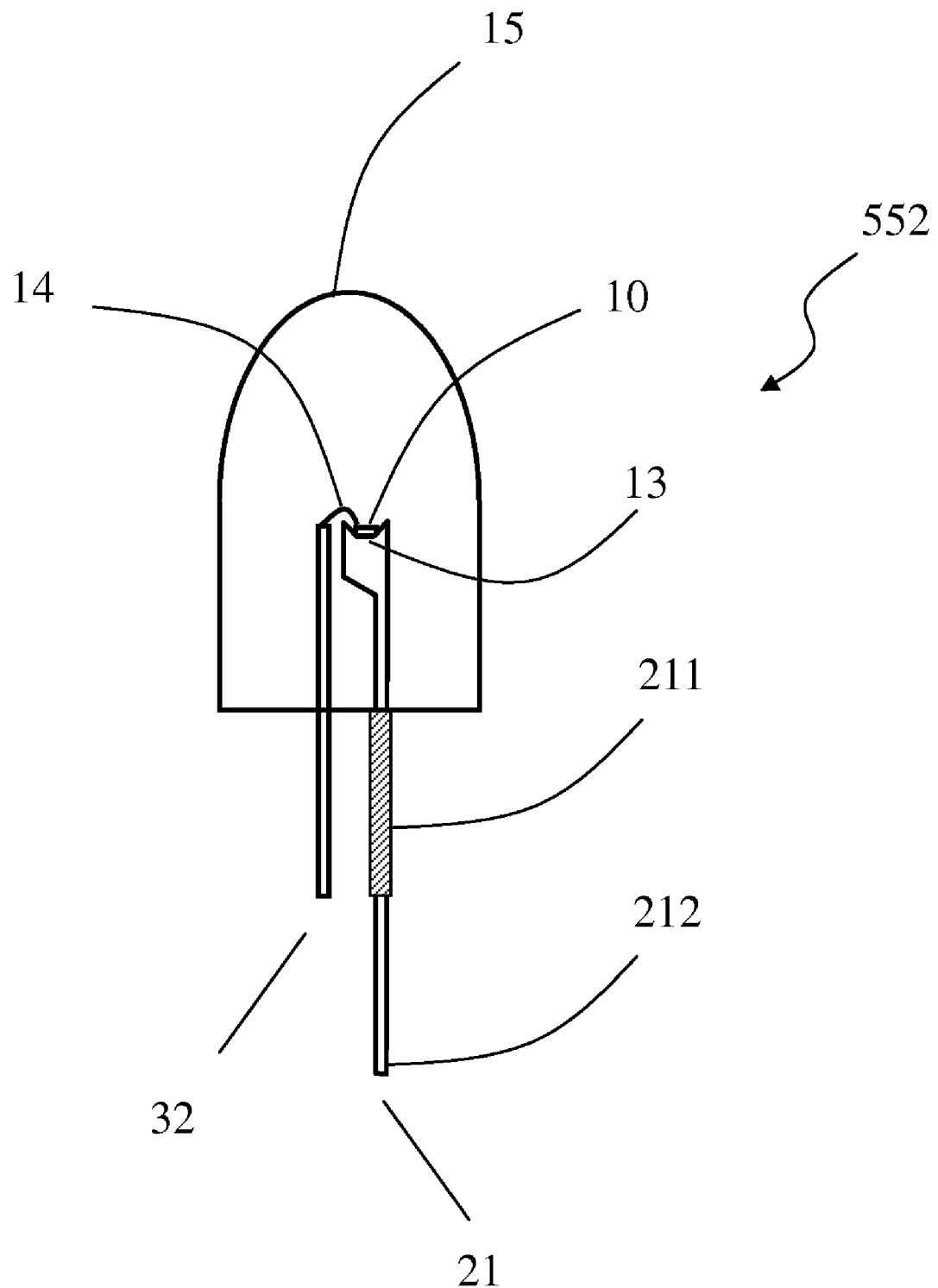
FIG. 4. shows a second embodiment of a staggered light unit according to the present invention.

FIG. 4. shows a second embodiment of a staggered light unit 552 according to the present invention. The staggered electrodes 21 and 32 are with non-equal lengths in contrast to the one shown in FIG. 2 where the staggered electrodes 21 and 22 are with substantially equal lengths. The short metal lead 32 functions as a top electrode of the staggered light unit 552, the bottom portion 212 of the long metal lead 21 functions as a bottom electrode of the staggered light unit 552. Note that short metal lead 32 does not include an insulated portion in the particular configuration shown in FIG. 4.

Figure 5:
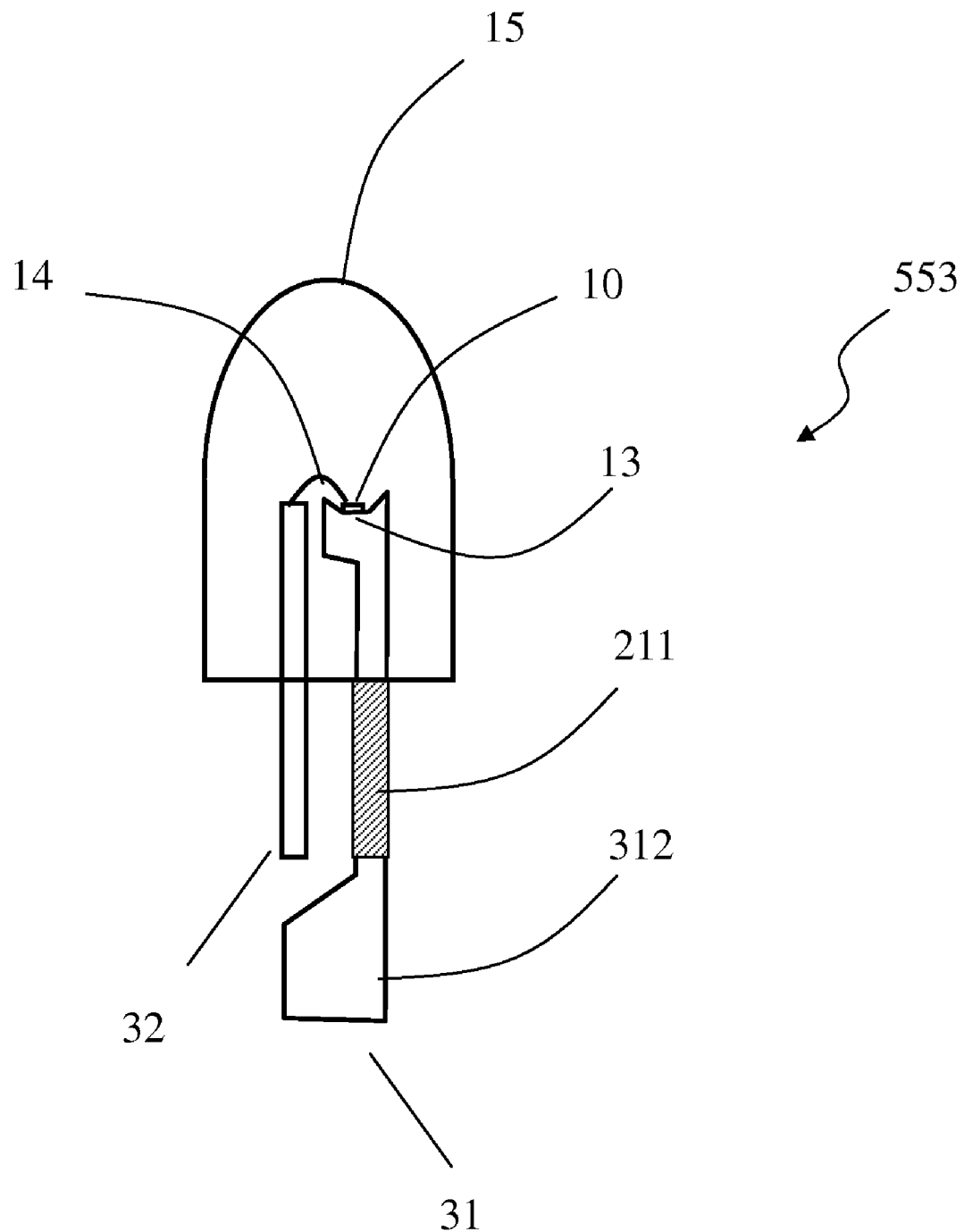
FIG. 5. shows a third embodiment of a staggered light unit according to the present invention.

FIG. 5. shows a third embodiment according to the present invention. A staggered light unit 553 has a long metal lead 31 and a short metal lead 32. The short metal lead 32 functions as a top electrode of the staggered light unit 553. The bottom portion 312 of the long metal lead 31 is made wider than the top portion of the lead 31. The widened bottom electrode 312 is to increase its contact area to ensure a better electrical coupling reliability. Insulation material 211 wraps the portion of lead 31 that is below the glue protection 15 and parallel with the short lead 32.

Figure 6:
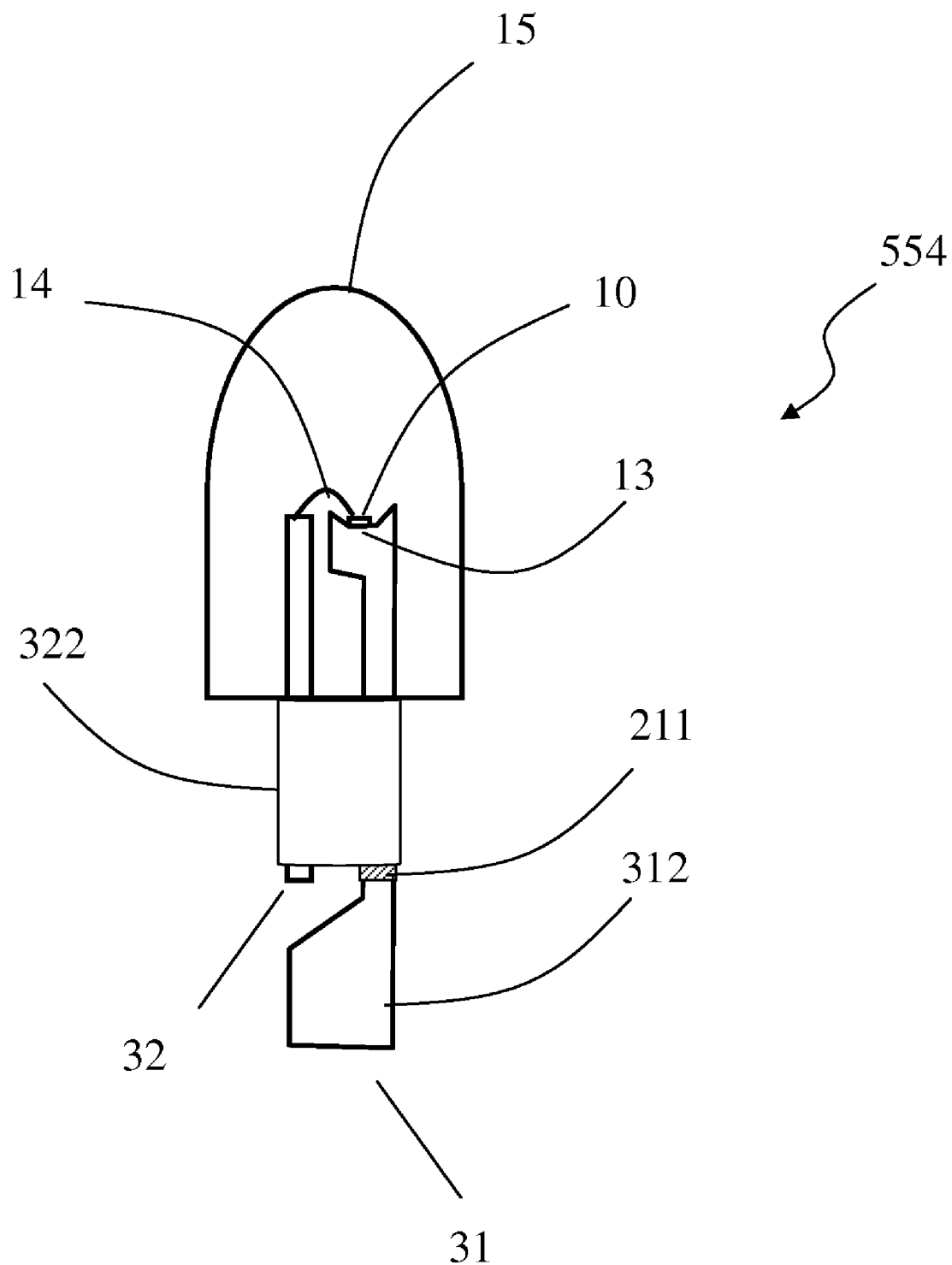
FIG. 6. shows a fourth embodiment of a staggered light unit according to the present invention.

FIG. 6. show a fourth embodiment according to the present invention. A staggered light unit 554 has a short metal lead 32 and a long metal lead 31. An insulated portion 211 of metal lead 31 is parallel with the short metal lead 32. A metal sleeve 322 wraps portions of the two metal leads 31 and 32 below the glue protection 15 and is electrically coupled to the short metal lead 32. The metal sleeve 322 is used to widen the contact surface of the short metal lead 32 to ensure proper electrical coupling reliability.

Figure 7:
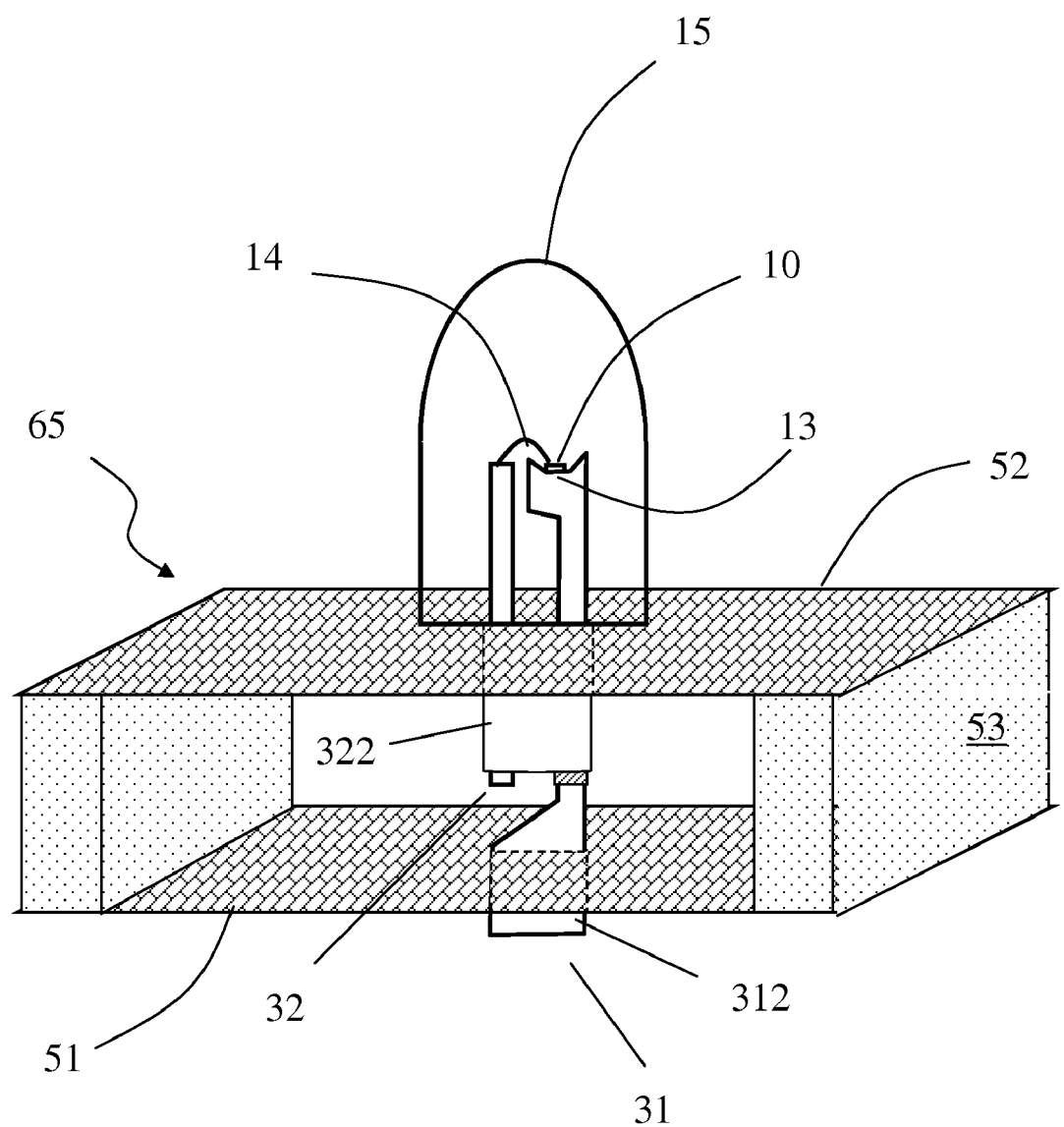
FIG. 7. shows a first sandwiched substrate with an inserted staggered light unit of FIG. 6.

FIG. 7. shows a sandwich substrate with a staggered light unit of FIG. 6 inserted therein. When the staggered light unit 554 is inserted into the sandwich substrate 65, the metal sleeve 322 is electrically coupled to the top metal layer 52 of the sandwich substrate 65. The bottom electrode 312 of the staggered light unit 554 is electrically coupled to the bottom metal layer 51. Typically, the sectional area of a single lead is around 0.5 mm by 0.5 mm, for allowing easy insertion of the light unit. The dimension of the metal leads of the light units can be made smaller or larger if necessary.

Figure 8:
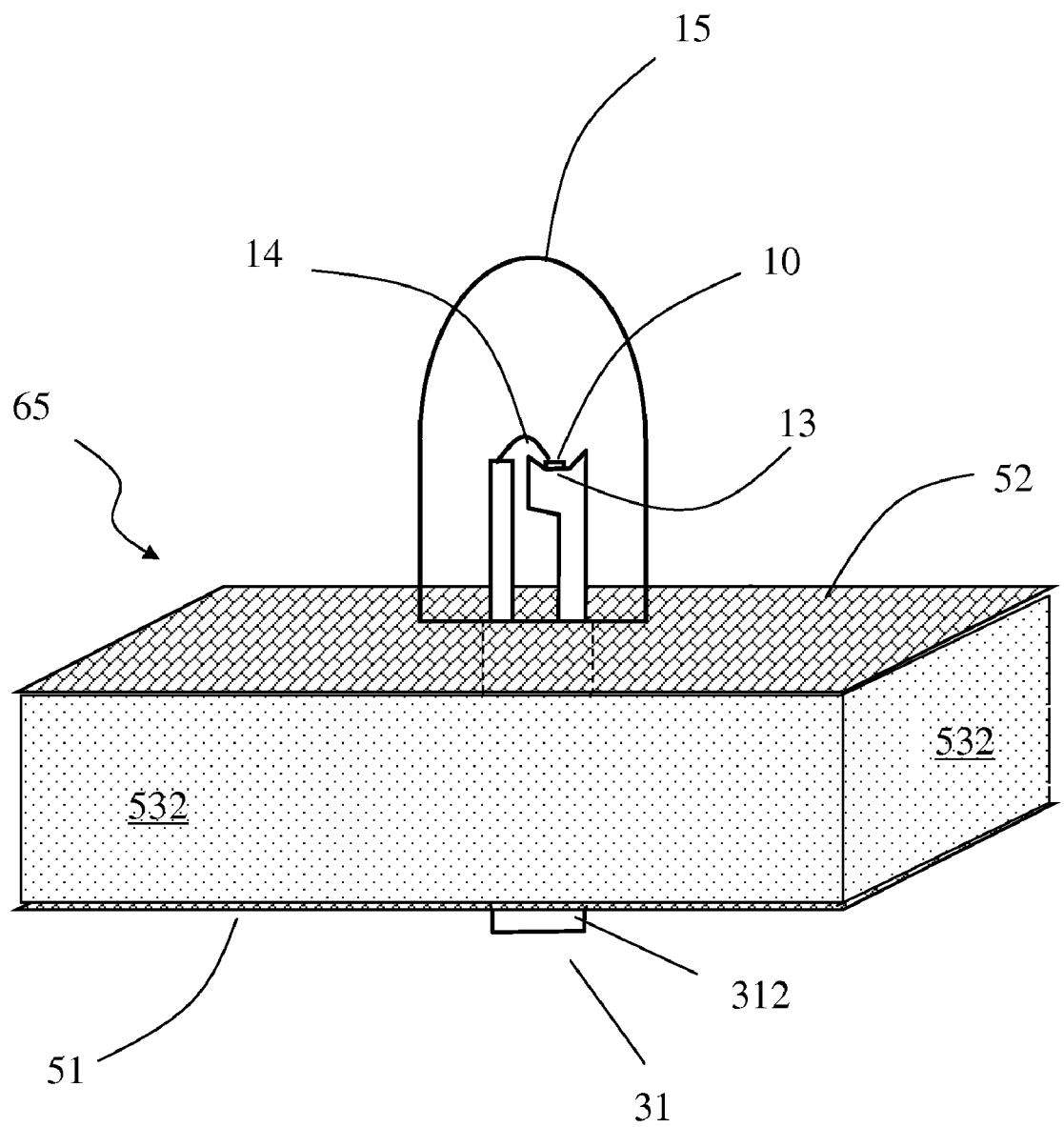
FIG. 8. shows a second sandwiched substrate with an inserted staggered light unit of FIG. 6.

FIG. 8. shows a second embodiment of the sandwich substrate. It discloses an MIM substrate 65 with an insulation material 532 filled in between the first metal layer 51 and the second metal layer 52. This is contrast to the one shown in FIG. 7 where the insulation material 53 are partially filled in between the first metal layer 51 and the second metal layer 52. The metal leads 31 and 32 of the light unit 554 can be held more firmly by the sandwich substrate 65 with the completely filled insulation material 532. The metal layers 51 and 52 of the sandwich substrate 65 can be metal mesh or metal film that enables the insertion of the metal leads of the staggered light unit.

While several embodiments have been described, it will be apparent to those skilled in the art that various modifications may be made in the embodiments without departing from the spirit of the present invention. Such modifications are all within the scope of the present invention as defined by the appended claims.

What is claimed is:

1. A light unit with staggered electrodes, comprising:
a light source having a first electrode and a second electrode;
a first metal lead coupled to said first electrode;
a second metal lead coupled to said second electrode; and
an encapsulant sealing top portions of the first and second metal leads;
wherein
said first metal lead has an upper insulation portion below said encapsulant and a lower exposed conductive portion as a bottom electrode below said upper insulation portion;
said second metal lead has an upper exposed conductive portion as a top electrode below said encapsulant and a lower insulation portion below said upper exposed conductive portion;
said upper insulation portion has a length no less than that of the upper exposed conductive portion; and
said lower insulation portion has a length no less than that of the lower exposed conductive portion.

2. A light board for insertion of a light unit with staggered electrodes as defined in claim 1, said light board comprising:
a top metal layer;
a bottom metal layer; and
an insulation material sandwiched between said top and bottom metal layers;
wherein
said top and bottom metal layers are adapted to be electrically coupled to said top and bottom electrodes, respectively, when said light unit is inserted into said light board; and
at least said top metal layer is selected from the group consisting of metal mesh and metal thin film to be breakable by the insertion of the metal leads.

3. A light unit with staggered electrodes, comprising:
a light source having a first electrode and a second electrode;
a $1^{st}$ metal lead coupled to said first electrode;
a $2^{nd}$ metal lead shorter than the $1^{st}$ metal lead and coupled to said second electrode; and
an encapsulant sealing top portions of said $1^{st}$ and $2^{nd}$ metal leads;
wherein
said $1^{st}$ metal lead has an upper insulation portion below said encapsulant and a lower exposed conductive portion as a bottom electrode below said upper insulation portion;
said $2^{nd}$ metal lead has an exposed conductive portion as a top electrode below said encapsulant; and
said upper insulation portion has a length no less than that of the exposed conductive portion of said $2^{nd}$ metal lead.

4. The light unit as claimed in claim 3, wherein said lower exposed conductive portion is wider than said upper insulation portion.

5. The light unit as claimed in claim 4, further comprising:
a metal sleeve, that wraps around both the upper insulation portion of the $1^{st}$ metal lead and the exposed conductive portion of the $2^{nd}$ metal lead and is electrically coupled to said top electrode.

6. A light board for insertion of a light unit with staggered electrodes as defined in claim 3, said light board comprising:
a top metal layer;
a bottom metal layer; and
an insulation material sandwiched between said top and bottom metal layers;
wherein
said top and bottom metal layers are adapted to be electrically coupled to said top and bottom electrodes, respectively, when said light unit is inserted into said light board; and
at least said top metal layer is selected from the group consisting of metal mesh and metal thin film to be breakable by the insertion of the metal leads.

7. A light board for insertion of a light unit with staggered electrodes;
said light unit comprising:
a light source having a first electrode and a second electrode;
a first metal lead coupled to said first electrode, and having a first exposed conductive portion; and
a second metal lead coupled to said second electrode, and having a second exposed conductive portion staggered with respect to said first exposed conductive portion to form a top-bottom electrode structure; and
said light board comprising a metal/insulation/metal sandwich structure, wherein one of said metals is coupled to said top electrode and the other metal is coupled to said bottom electrode when said light unit is inserted into said light board.

8. A light board as claimed in claim 7, wherein at least one of said metals is selected from the group consisting of metal mesh and metal thin film to be breakable by the insertion of the metal leads.

* * * * *